United States Patent
Lockmiller et al.

(10) Patent No.: US 11,798,324 B2
(45) Date of Patent: Oct. 24, 2023

(54) SPARK IGNITER LIFE DETECTION

(71) Applicant: Champion Aerospace LLC, Liberty, SC (US)

(72) Inventors: Robert A. Lockmiller, Pickens, SC (US); Amit Toprani, Greenville, SC (US)

(73) Assignee: CHAMPION AEROSPACE LLC, Liberty, SC (US)

( * ) Notice: Subject to any disclaimer, the term of this patent is extended or adjusted under 35 U.S.C. 154(b) by 532 days.

(21) Appl. No.: 16/721,601

(22) Filed: Dec. 19, 2019

(65) Prior Publication Data

US 2020/0200091 A1 Jun. 25, 2020

Related U.S. Application Data

(60) Provisional application No. 62/783,374, filed on Dec. 21, 2018.

(51) Int. Cl.
  *G07C 5/08* (2006.01)
  *F02C 7/26* (2006.01)
  (Continued)

(52) U.S. Cl.
  CPC .............. *G07C 5/0808* (2013.01); *F02C 7/26* (2013.01); *F02P 15/003* (2013.01); *F02P 17/12* (2013.01);
  (Continued)

(58) Field of Classification Search
  CPC .......... G07C 5/0808; F02C 7/26; F02C 7/266; F02P 15/003; F02P 17/12; H01T 13/60;
  (Continued)

(56) References Cited

U.S. PATENT DOCUMENTS 3,705,988 A * 12/1972 Moyer et al. ........... F02P 7/067
  307/10.6
3,737,681 A * 6/1973 Rothermel .............. F02P 17/12
  123/484

(Continued)

FOREIGN PATENT DOCUMENTS

CN 106286072 A 1/2017
EP 1003967 B1 2/2005
(Continued)

OTHER PUBLICATIONS

International Search Report corresponding to International Application No. PCT/US2019/067630, dated Apr. 23, 2020, 3 pages.
(Continued)

*Primary Examiner* — Joseph J Dallo
(74) *Attorney, Agent, or Firm* — REISING ETHINGTON P.C.

(57) ABSTRACT

A device for monitoring a life condition of a spark igniter in a gas turbine ignition system. The device includes an evaluation circuit having circuit components that include a hold capacitor, a transistor, and an operational amplifier arranged to form a sample-and-hold circuit, wherein an igniter spark impulse signal is applied to an input node of the evaluation circuit causing the transistor to turn on and the hold capacitor to discharge for a duration of the igniter spark impulse signal, and wherein a discharged voltage at the hold capacitor is maintained and output by the operational amplifier, the discharged voltage representing the duration of the igniter spark impulse and indicating the life condition of the spark igniter.

11 Claims, 1 Drawing Sheet

(51) Int. Cl.
*F02P 17/12* (2006.01)
*H01T 13/60* (2011.01)
*F02P 15/00* (2006.01)

(52) U.S. Cl.
CPC .......... *H01T 13/60* (2013.01); *F05D 2220/32* (2013.01); *F05D 2260/83* (2013.01)

(58) Field of Classification Search
CPC ............. F05D 2220/32; F05D 2260/83; F05D 2260/80
See application file for complete search history.

(56) References Cited

U.S. PATENT DOCUMENTS

| | | | |
|---|---|---|---|
| 4,760,341 A | 7/1988 | Skerritt | |
| 5,049,786 A * | 9/1991 | Gotisar | H01T 1/00 315/209 T |
| 5,075,627 A | 12/1991 | Bodig et al. | |
| 5,155,437 A | 10/1992 | Frus | |
| 5,194,813 A * | 3/1993 | Hannah | F02P 17/00 324/392 |
| 5,343,154 A | 8/1994 | Frus | |
| 5,508,618 A | 4/1996 | Owens | |
| 5,523,691 A | 6/1996 | Frus | |
| 5,571,245 A * | 11/1996 | Ooyabu | F02P 3/0442 123/647 |
| 5,572,135 A | 11/1996 | Owens | |
| 5,675,257 A | 10/1997 | Frus | |
| 6,486,566 B1 | 11/2002 | Schumacher et al. | |
| 6,521,869 B1 * | 2/2003 | Donnelly | F23Q 3/004 431/66 |
| 6,642,718 B2 | 11/2003 | Brushwo | |
| 7,375,531 B2 | 5/2008 | Ponziani | |
| 9,135,755 B2 | 9/2015 | Youssef | |
| 2005/0126544 A1 | 6/2005 | Ott | |
| 2007/0135987 A1 | 6/2007 | Coffey et al. | |
| 2017/0089577 A1 | 3/2017 | Desilva et al. | |
| 2018/0306163 A1 | 10/2018 | Rezaei et al. | |

FOREIGN PATENT DOCUMENTS

| | | | |
|---|---|---|---|
| JP | 2003176751 A | 6/2003 | |
| JP | 2005226647 A | 2/2005 | |
| JP | 2017521623 A | 8/2017 | |
| KR | 100207117 A | 7/1998 | |
| WO | 9804830 A1 | 2/1998 | |
| WO | WO2006078673 A1 | 7/2006 | |
| WO | WO-2013133107 A1 * | 9/2013 | ............... C21D 1/09 |
| WO | 2015171571 A2 | 11/2015 | |

OTHER PUBLICATIONS

Written Opinion corresponding to International Application No. PCT/US2019/067630, dated Apr. 23, 2020, 4 pages.
Chinese Office Action corresponding to application No. 2021535831, dated Jun. 28, 2022, 5 pages.
European Search Report corresponding to application No. 19900076.1, dated Jan. 20, 2023, 10 pages.

* cited by examiner

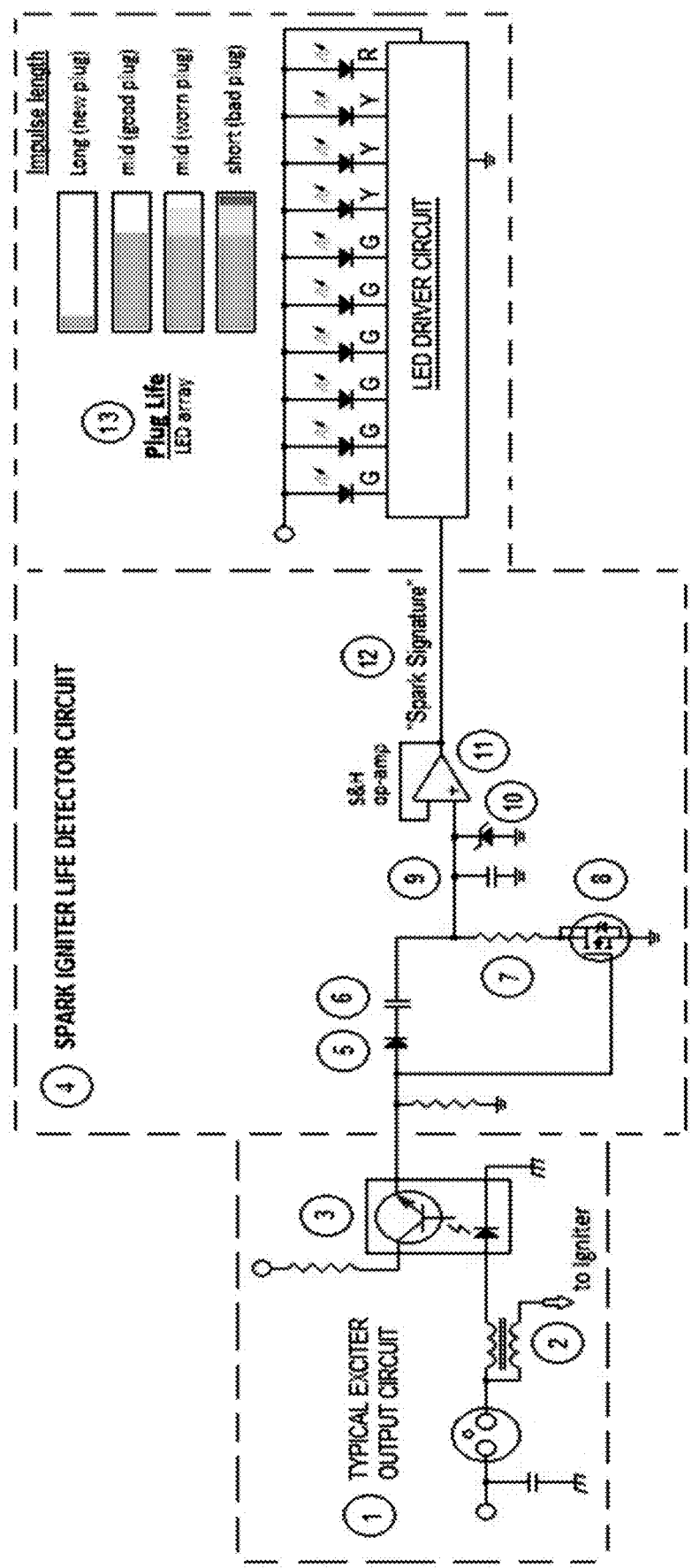

SPARK IGNITER LIFE DETECTION

TECHNICAL FIELD

The present invention relates to ignition systems for gas turbine engines, and in particular, to a system and method for determining the life condition of a spark igniter.

BACKGROUND

A typical turbine engine requires a source of ignition to start the turbine operational cycle. This ignition source is most often provided by a spark ignition system. A typical ignition system generally includes one or more ignition subsystems that each include an exciter circuit, an ignition lead, and an igniter (also referred to herein as a spark igniter or spark plug).

The exciter circuit converts electrical energy supplied by a battery, power bus or alternator into a series of high voltage impulses. These impulses are routed through an appropriate ignition lead to the igniter to produce a spark between the electrodes (or tip) of the igniter. Igniters are commonly used in aircraft engines and electrical power generating turbine engines, but are also used in automobile internal combustion engines where they are referred to as spark plugs.

SUMMARY

In accordance with an aspect of the invention, there is provided a device for monitoring a life condition of a spark igniter in a gas turbine ignition system. The device comprises an evaluation circuit configured to determine a duration of a spark impulse, wherein the evaluation circuit includes an input node that receives an igniter spark impulse signal. The evaluation circuit has circuit elements that include:
- a hold capacitor operatively coupled to the input node through a series connection of an input diode and an integrator capacitor, wherein applying the igniter spark impulse signal to the input node resets the hold capacitor;
- a transistor operatively coupled to the hold capacitor through a resistor, wherein a gate terminal of the transistor is connected to the input node such that the transistor turns on when the igniter spark impulse signal is applied to the input node and turns off when the igniter spark impulse signal ends, and wherein the transistor being turned on causes the hold capacitor to partially discharge over the duration of the igniter spark impulse; and
- an amplifier connected to the hold capacitor and configured to output a voltage that is dependent on the voltage level of the discharged hold capacitor, wherein the voltage represents the duration of the igniter spark impulse as an indication of the life condition of the spark igniter.

The device of the preceding paragraph may further include any or more of the following features in any technically feasible combination:
- the evaluation circuit is connected to an exciter circuit and configured to receive the igniter spark impulse signal through an opto-isolator in the exciter circuit;
- the device further includes an indicator circuit configured to receive the output voltage of the amplifier and to convert the output voltage to a visual representation that indicates the duration of the igniter spark impulse;
- the indicator circuit further includes an LED driver circuit configured to illuminate a number of LEDs that correspond to the duration of the igniter spark impulse;
- the amplifier is an operational amplifier configured as a unity gain buffer;
- the hold capacitor, the transistor, and the operational amplifier form a sample-and-hold circuit;
- the evaluation circuit further includes a diode connected to the amplifier to prevent the voltage at an input of the operational amplifier from exceeding a threshold;
- the life condition of the spark igniter represents a degree of electrode erosion in the spark igniter; and
- the hold capacitor is discharged at a rate controlled by the resistor.

A device for monitoring a life condition of a spark igniter in a gas turbine ignition system, the device comprising:
- an evaluation circuit having circuit components that include a hold capacitor, a transistor, and an operational amplifier arranged to form a sample-and-hold circuit, wherein an igniter spark impulse signal is applied to an input node of the evaluation circuit causing the transistor to turn on and the hold capacitor to partially discharge over a duration of the igniter spark impulse signal, and wherein a discharged voltage at the hold capacitor is maintained and output by the operational amplifier, the discharged voltage representing the duration of the igniter spark impulse as an indication of the life condition of the spark igniter.

BRIEF DESCRIPTION OF THE DRAWINGS

One or more embodiments of the invention will hereinafter be described in conjunction with the appended drawings, wherein like designations denote like elements, and wherein the FIGURE depicts an exemplary embodiment of a system for determining the life condition of a spark igniter in accordance with the invention.

DETAILED DESCRIPTION

The monitoring of ignition systems for gas turbine engines is of particular interest because such systems are commonly used to initiate and maintain combustion of aircraft engines. By monitoring the performance of ignition systems in gas turbine engines, an indication that the system is malfunctioning can be obtained. By providing an indication of a malfunctioning ignition system, a measure of safety is obtained that can be of particular importance in ensuring the ignition system is capable of restarting an engine after a flameout has occurred, or to initiate a maintenance cycle prior to the next flight.

In monitoring ignition systems of gas turbine engines, the state of health of the igniter plug is often the focus since the igniter plug is the component of the ignition system with a limited life expectancy due to normal igniter electrode erosion. A means for evaluating the erosion condition (i.e., life condition) of the igniter is extremely beneficial to an operator.

Spark duration over the operating life of the igniter, or spark plug, is generally reduced (i.e., the rate of discharge is greater) due to normal erosion of the igniter electrodes. The system and method disclosed below recognizes this decrease in spark duration as a means to determine the wear (i.e., erosion) or life condition of the igniter. In this way, a practical assessment of igniter life may be made by way of observation of the spark duration without having to remove the igniter from the engine for inspection.

An ignition sequence in a gas turbine engine is typically initiated by a narrow high voltage pulse generated by an exciter circuit. For a successful ignition, the high voltage pulse is discharged at the igniter plug, thereby generating a spark. In determining the life condition of the igniter, it's advantageous to differentiate between the characteristics of the exciter and the igniter and to recognize that a "healthy discharge" from the exciter typically has a maximum value for impulse duration or minimum discharge rate, while the "healthy discharge" of the igniter has a minimum spark duration or a maximum rate of discharge.

The FIGURE illustrates an exemplary device for monitoring a life condition of a spark igniter in a gas turbine ignition system. The device includes an evaluation circuit connected to an output of an exciter circuit (1), which is shown in simplified form having an output (2) to the igniter. The output to the igniter produces a current or spark impulse signal during normal and abnormal operations that is coupled through the opto-isolator (3) to produce a signal of a level and character that is suitable for input to the evaluation circuit (4). The igniter spark impulse signal is applied to an input node of the evaluation circuit (4), and through a series connection of a diode (5) and an integrator capacitor (6). The spark impulse signal being applied through the diode (5) and the integrator capacitor (6) momentarily charges or resets a hold capacitor (9). The time period of the reset is sufficiently small relative to the overall spark repetition period to be undetectable or insignificant to the observer.

The igniter spark impulse signal is also applied through the input node to a gate terminal of a field effect transistor (FET) (8) for the duration of the impulse signal. The FET (8) operates here as a switching mechanism in what is known in the art as a sample-and-hold circuit formed by the combination of the FET (8), the hold capacitor (9), and an operational amplifier (11), which as shown in FIG. 1 is configured as a voltage follower. In this configuration, the FET (8) turns on and acts like a closed switch to discharge the hold capacitor (9) for the duration of the spark impulse signal. The hold capacitor (9) is discharged at a rate controlled by the resistor (7). The Zener diode 10 ensures the voltage does not exceed a predetermined level or threshold.

As the hold capacitor (9) is discharged, the same voltage appears at the output of the operational amplifier (11), which is configured as a unity gain buffer. At the end of the spark period, when the voltage at the gate of the FET (8) is zero, the FET (8) is switched off, thereby interrupting the discharge of the hold capacitor (9). Since the input impedance of the operational amplifier (11) is high, the voltage of the hold capacitor (9) at the non-inverting input of the operational amplifier (11) is retained and it appears at the output of the operational amplifier (11) as a "spark signature" (12). This voltage level, or spark signature, is representative of the duration of the igniter spark. For example, a longer spark duration results in a lower "Spark Signature" voltage and a shorter spark duration results in a higher "Spark Signature" voltage, wherein the short spark duration indicates a greater degree of electrode erosion.

In one particular embodiment, the spark signature voltage (12) is used in an indicator circuit (13) to set an LED array to indicate by way of the quantity of illuminated LED's, the duration of the spark impulse. The LED array indication can then be interpreted by the user as a visual indicator of igniter life condition, i.e., the degree of igniter erosion. One of ordinary skill in the art appreciates that the LED array shown in FIG. 1 is exemplary and that other methods, circuits, and visual indicators may be utilized to represent and indicate the spark impulse signal to the user.

It should be appreciated that the drawings and descriptions previously discussed are only meant to illustrate some of the potential embodiments of the disclosed device. For instance, the different dashed lines and boxes drawn around different combinations of components are not meant to be strict or specific boundaries or perimeters of the devices they represent. Rather, they are simply provided to help illustrate some of the different components, devices, sections, etc. of exemplary device.

Moreover, skilled artisans will appreciate that the evaluation circuit (4) may include a different combination of components and devices than those illustrated in FIG. 1, including combinations having more, less or different components than those shown. In addition, the type of transistor is not limited to a field effect transistor, or to the transistor pin configuration shown in FIG. 1.

It is to be understood that the foregoing is a description of one or more embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A device for monitoring a life condition of a spark igniter in a gas turbine ignition system, the device comprising:

an evaluation circuit configured to determine a duration of an ignition spark impulse, wherein the evaluation circuit includes an input node that receives an igniter spark impulse signal, the evaluation circuit having circuit elements that include:

a hold capacitor operatively coupled to the input node through a series connection of an input diode and an integrator capacitor, wherein applying the igniter spark impulse signal to the input node resets the hold capacitor;

a transistor operatively coupled to the hold capacitor through a resistor, wherein a gate terminal of the transistor is connected to the input node such that the transistor turns on when the igniter spark impulse signal is applied to the input node and turns off when the igniter spark impulse signal ends, and wherein the transistor being turned on causes the hold capacitor to partially discharge over the duration of the igniter spark impulse; and an amplifier connected to the hold capacitor and configured to output a voltage that is dependent on the voltage level of the partially discharged hold capacitor, wherein the voltage represents the duration of the igniter spark impulse as an indication of the life condition of the spark igniter.

2. The device of claim 1, wherein the evaluation circuit is connected to an exciter circuit and configured to receive the igniter spark impulse signal through an opto-isolator in the exciter circuit.

3. The device of claim 1, further including an indicator circuit configured to receive the output voltage of the amplifier and to convert the output voltage to a visual representation that indicates the duration of the igniter spark impulse.

4. The device of claim 3, wherein the indicator circuit further includes an LED driver circuit configured to illuminate a number of LEDs that correspond to the duration of the igniter spark impulse.

5. The device of claim 1, wherein the amplifier is an operational amplifier configured as a unity gain buffer.

6. The device of claim 1, wherein the hold capacitor, the transistor, and the operational amplifier form a sample-and-hold circuit.

7. The device of claim 1, wherein the evaluation circuit further includes a diode connected to the amplifier to prevent the voltage at an input of the operational amplifier from exceeding a threshold.

8. The device of claim 1, wherein the life condition of the spark igniter represents a degree of electrode erosion in the spark igniter.

9. The device of claim 1, wherein the hold capacitor is discharged at a rate controlled by the resistor.

10. A device for monitoring a life condition of a spark igniter in a gas turbine ignition system, the device comprising:

an evaluation circuit having circuit components that include a hold capacitor, a transistor, and an operational amplifier arranged to form a sample-and-hold circuit, wherein an igniter spark impulse signal is applied to an input node of the evaluation circuit causing the transistor to turn on and the hold capacitor to partially discharge over a duration of the igniter spark impulse signal, and wherein a partially discharged voltage at the hold capacitor is maintained and output by the operational amplifier, the partially discharged voltage representing the duration of the igniter spark impulse as an indication of the life condition of the spark igniter.

11. A device for monitoring a life condition of a spark igniter, the device comprising:

an evaluation circuit having circuit components that include a hold capacitor, a transistor, and an amplifier arranged to form a sample-and-hold circuit, wherein, during sparking of the igniter, a spark impulse signal having a duration equal to a duration of a spark on the igniter is applied to an input node of the evaluation circuit causing the transistor to adjust a voltage on the hold capacitor to a value indicative of the duration of the spark impulse signal, and wherein the voltage at the hold capacitor is held and output by the amplifier, the voltage representing the duration of the spark on the igniter as an indication of the life condition of the igniter;

wherein the device further includes an indicator circuit configured to receive the output voltage of the amplifier and to convert the output voltage to a visual representation that indicates the duration of the igniter spark impulse.

* * * * *